US007384857B2

(12) United States Patent
Hargrove

(10) Patent No.: US 7,384,857 B2
(45) Date of Patent: Jun. 10, 2008

(54) METHOD TO FABRICATE COMPLETELY ISOLATED SILICON REGIONS

(75) Inventor: Michael Hargrove, Clinton Corners, NY (US)

(73) Assignee: Seiko Epson Corporation, Tokyo (JP)

( * ) Notice: Subject to any disclaimer, the term of this patent is extended or adjusted under 35 U.S.C. 154(b) by 150 days.

(21) Appl. No.: 11/066,206

(22) Filed: Feb. 25, 2005

(65) Prior Publication Data

US 2006/0194411 A1     Aug. 31, 2006

(51) Int. Cl.
*H01L 21/76*     (2006.01)
(52) U.S. Cl. .................. 438/423; 438/404; 438/766; 257/E21.248
(58) Field of Classification Search ................ 438/586, 438/423, 404–405, 449–451, 766, 769–770; 468/766; 257/349, E21.24, E21.248
See application file for complete search history.

(56) References Cited

U.S. PATENT DOCUMENTS

| 5,438,015 | A | | 8/1995 | Lur |
| 5,466,630 | A | | 11/1995 | Lur |
| 5,468,657 | A | * | 11/1995 | Hsu ........................... 438/766 |
| 5,841,171 | A | | 11/1998 | Iwamatsu et al. |
| 6,069,054 | A | * | 5/2000 | Choi ........................... 438/423 |
| 6,191,008 | B1 | | 2/2001 | So |
| 6,249,026 | B1 | * | 6/2001 | Matsumoto et al. ......... 257/349 |
| 6,362,070 | B1 | | 3/2002 | Villa et al. |
| 6,506,662 | B2 | | 1/2003 | Ogura et al. |
| 6,593,637 | B1 | | 7/2003 | Ibok |
| 6,869,867 | B2 | * | 3/2005 | Miyashita et al. .......... 438/586 |

OTHER PUBLICATIONS

"Characteristics of MOS Capacitors of $BF_2$ or B Implanted Polysilicon Gate with and without $POCl_3$ Co-doped", J.C. Hsieh, et al., *IEEE* Electron Device Letters, vol. 14, No. 5, May 1993, pp. 222-224.
"The Effect of Fluorine in Silicon Dioxide Gate Dielectrics", P. J. Wright, et al., *IEEE* Transactions on Electron Devices, vol. 36, No. 5, May 1989, pp. 879-889.

* cited by examiner

*Primary Examiner*—Thanhha S. Pham
(74) *Attorney, Agent, or Firm*—Rosalio Haro

(57) ABSTRACT

The construction of Shallow Trench Isolation, STI, regions is integrated in to a SIMOX fabrication process for a Silicon On Insulator, SOI, wafer. Prior to the beginning of the SOI process, a preferred nitrogen ($N_2$) implant is applied to the silicon wafer in areas designated as active regions. The nitrogen modifies the oxidation rate of later implanted oxygen. Regions where the $N_2$ is implanted result in thinner oxide layers. The SIMOX process can begin following the implantation of nitrogen. This results in buried regions of thick and thin oxide layers at fixed depths in the Si substrate. Excess Si on top of the buried thick and thin oxide regions can be polished down to the thick oxide regions to form the active device regions over the thin oxide regions. Thus, the SOI wafer exhibits an STI structure upon completion of the SOI process without a need for additional STI manufacturing steps.

22 Claims, 5 Drawing Sheets

METHOD TO FABRICATE COMPLETELY ISOLATED SILICON REGIONS

BACKGROUND OF THE INVENTION

1. Field of the Invention

The present invention relates to the construction of isolation region in integrated circuits, and particularly relates to the construction of isolation regions in silicon on insulator, SOI, structures.

2. Description of the Related Art

Silicon on insulator, SOI, is fast becoming the technology of choice for high performance MOS integrated circuits. Circuits constructed on SOI wafers are more resistant to high voltage damage (such as from drain-to-source punch through), are relatively immune from latchup problems, and have less parasitic capacitance as compared to bulk or epitaxial wafers. However, SOI wafers are more expensive, and thus any reduction in the production of SOI based circuits is of importance in reducing cost.

With reference to FIG. 1, a SOI wafer 11 is characterized by an insulator layer 13 buried under its top semiconductor layer 17. Buried insulator layer 13 separates the bulk substrate silicon region 15 from the top active silicon region 17, within which integrated circuits are constructed. As shown in FIG. 2, top layer 17 needs to be divided into active regions 19, within which circuits are constructed, separated by insulation regions 21. Thus, an initial step in the construction of any integrated circuit on a SOI wafer is to subdivide the wafer into active regions and insulation regions.

A preferred insulation method used in SOI technology is shallow trench isolation, STI, which provides a planar surface for further processing and avoids some of the problems inherent to less geometrically defined isolation structures, such as bird's beak issues found in LOCOS isolation.

There are various method of constructing a SOI wafer, including Silicon-On-Sapphire (SOS), Separation by Implanted Oxygen (SIMOX), and wafer bonding (WB). Of these three, SIMOX is the most commonly used method.

With reference to FIG. 3, a typical manufacturing process for constructing shallow trench isolation regions in a SOI wafer starting with a SIMOX process begins with a high dose implantation of oxygen ions O+ ($\sim 2 \times 10^{18}$/cm$^2$) at a high energy of about 150-300 keV. This results in a layer 22 of buried oxygen ions O+ deep under the surface of the silicon wafer 11. This ion implantation step is typically executed at a temperature greater than 400° C. to ensure that the silicon maintains its crystallinity during the implantation.

Wafer 11 is then subjected to a heat anneal step ($\sim$3-5 hours), preferably in an $N_2$ atmosphere, at a high temperature of about 1100-1175° C. This permits the buried oxygen ions O+ to diffuse and recombine with the silicon to produce a buried oxide layer (SiO) as shown in FIG. 4, and additionally helps to remove any defects that may have been created during the ion implantation step. This process results in a typical top silicon layer of about 0.5 µm. If a top layer thicker than can be practically achieved by the ion implantation depth is desired, then an optional epitaxial silicon layer, not shown, may be deposited on the top silicon layer 17. At this point, construction of the SOI wafer structure is complete and construction of the isolation regions can begin.

With reference to FIG. 5, construction of the shallow trench isolation regions begins by growing a padding layer of oxide 21, followed by a deposition of a silicon nitride layer 20 by LPCVD, as shown in FIG. 6. Silicon nitride layer 20 is then configured into a mask layer 23 by means of a resist, as shown in FIG. 7. The pad oxide 21 in exposed regions is likewise removed in FIG. 7. Mask layer 23 covers the intended active regions, and exposes the areas where isolation trenches are to be constructed.

In FIG. 8, trenches 24 are form in an anistropic-etching step, typically to a depth of about 400-500 nm. This is followed by growth of a thin thermal oxide layer 25 within trenches 24.

In FIG. 9, a CVD dielectric layer 27 is deposited to fill the trenches. Dielectric layer 27 also covers silicon nitride layers 23. The wafer is then subjected to a chemical mechanical polishing step, CMP, to polish back dielectric layer 27, with silicon nitride layer 23 functioning as a CMP-stop layer, as shown in FIG. 10. The dielectric material is typically then densified at 900° C. Finally in FIG. 11, the silicon nitride is stripped, leaving the desired STI structure of active regions 19 separated by shallow trench isolation regions 21.

OBJECTS OF THE INVENTION

It is an object of the present invention to provide a simplified fabrication method for constructing STI isolation structures in SOI wafer.

It is a further object to integrate the construction of STI isolation regions into the fabrication process of a SOI wafer.

It is still another object of the present invention to eliminate the need for applying an STI manufacturing process after finishing construction of a SOI wafer.

SUMMARY OF THE INVENTION

The present invention utilizes a nitrogen ($N_2$) implant into the silicon Si wafer prior to the SIMOX process to modify the oxidation of the implanted oxygen. Regions where the $N_2$ is implanted result in thinner oxide layers. By simply masking the active Si regions and implanting $N_2$, followed by the SIMOX process, buried regions of thick and thin oxide layers can be formed at fixed depths in the Si substrate. The remaining Si layer on top of the buried oxide can be polished down to form the active device regions. Conversely, thick and thin oxide layer may also be constructed by implanting fluorine. In this case, the fluorine enhance the oxidation growth rate in silicon and thinner oxide layers are thus formed in regions where fluorine is not implanted.

By utilizing the properties of implanted $N_2$ in Si (or flouring in silicon) to form layers of oxide with different thickness, in conjunction with a SIMOX process to form SOI, completely isolated regions of Si can be formed on a Si wafer during the SOI manufacturing. By utilizing this process, standard additional processing steps for constructing shallow trench isolation regions, i.e. STI regions, can be omitted since the Si islands are completely isolated and do not require further isolation following the construction of the SOI wafer. The overall process flow is much more simple than the standard STI process since the fairly complicated isolation mask/etch/deposition process steps inherent to STI processes are replaced by a simple mask/$N_2$ step integrated into the SOI process. The resulting isolated active Si regions can then be used to fabricate advanced MOSFET devices for high performance and/or low-power CMOS technology.

Other objects and attainments together with a fuller understanding of the invention will become apparent and appreciated by referring to the following description and claims taken in conjunction with the accompanying drawings.

BRIEF DESCRIPTION OF THE DRAWINGS

In the drawings wherein like reference symbols refer to like parts.

DESCRIPTION OF THE PREFERRED EMBODIMENTS

The present invention provides a method of simultaneously constructing shallow trench isolation, STI, regions during the construction of a SIMOX silicon on insulator, SOI, wafer. This is achieved by the addition of a selective ion implantation step prior to initialization of a SIMOX process.

Figure 1:
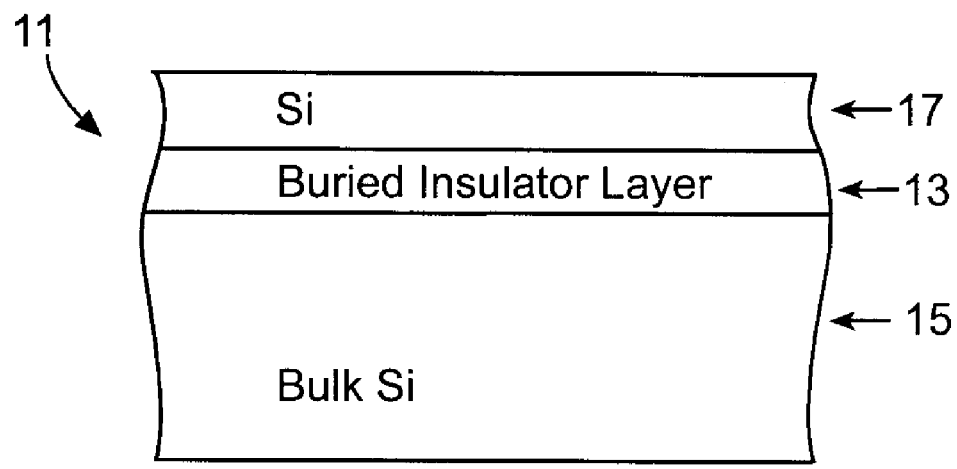
FIG. 1 is a symbolic side view of a typical silicon on insulator, SOI, wafer.
Figure 2:
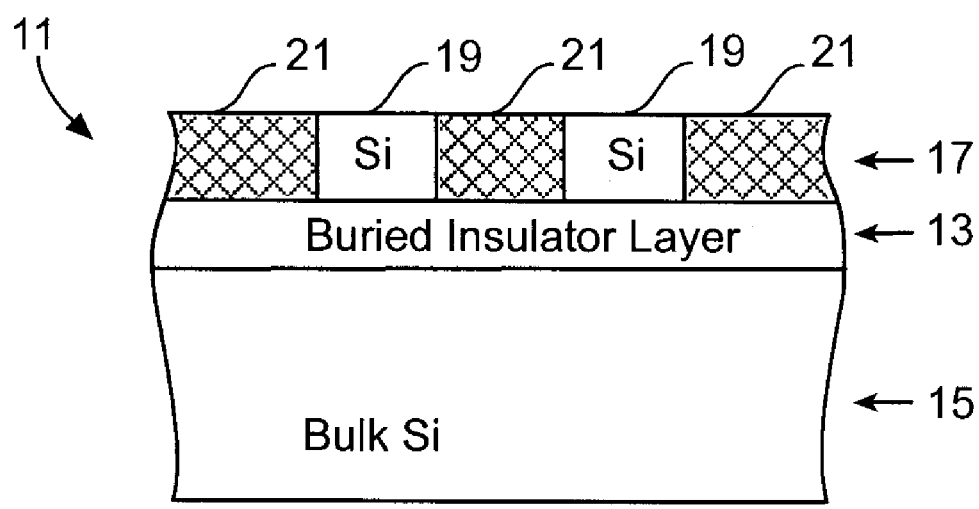
FIG. 2 is a symbolic side view of shallow trench isolation, STI, regions constructed on the SOI wafer of FIG. 1.
Figure 3:
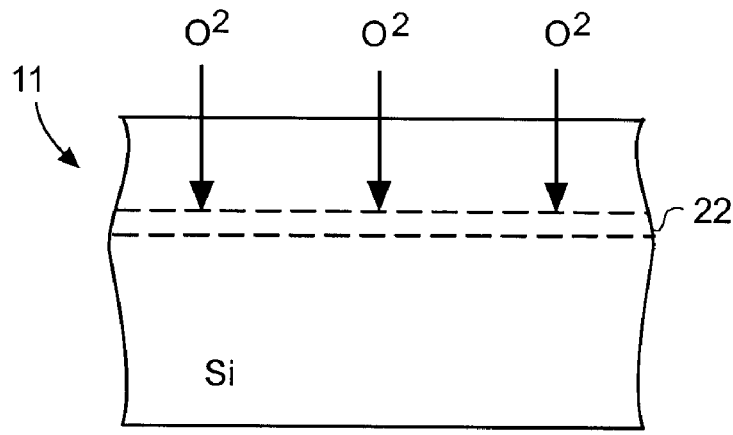
FIGS. 3 and 4 illustrate a typical SIMOX process for fabricating an SOI wafer.
Figure 4:
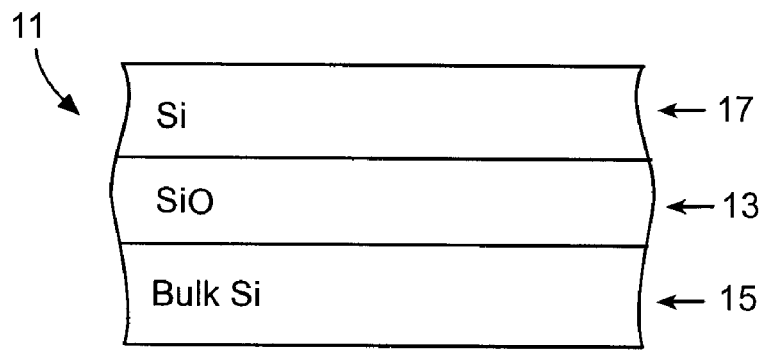
Figure 5:
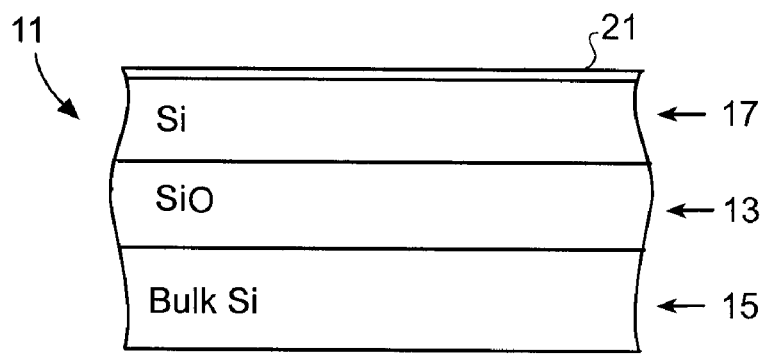
FIGS. 5 to 11 illustrate a typical method for constructing STI isolation regions on a SOI wafer.
Figure 6:
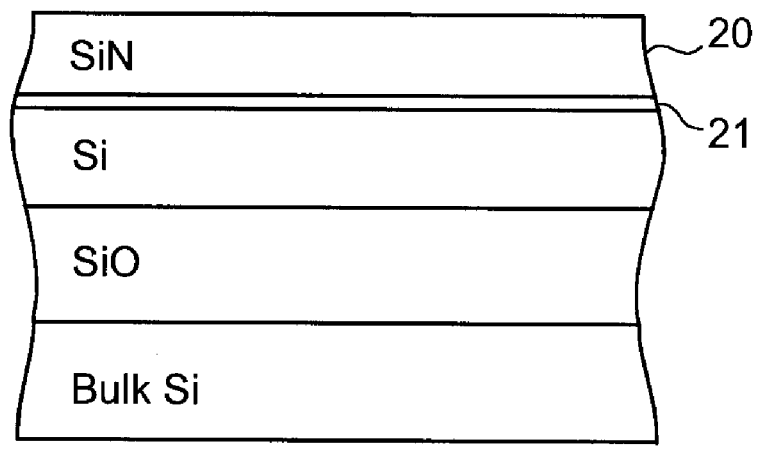
Figure 7:
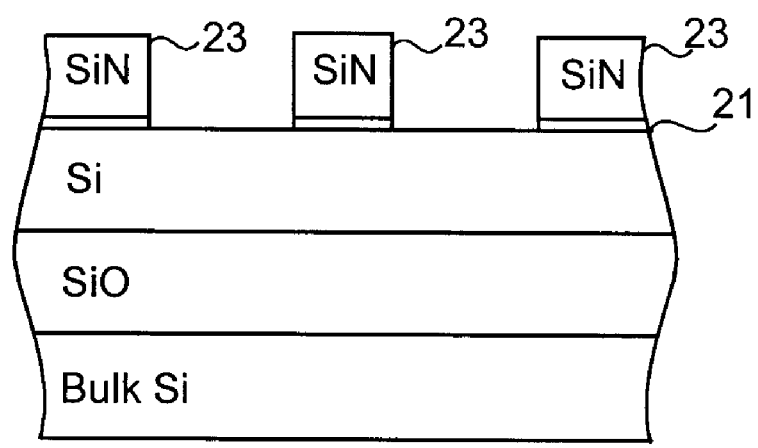
Figure 8:
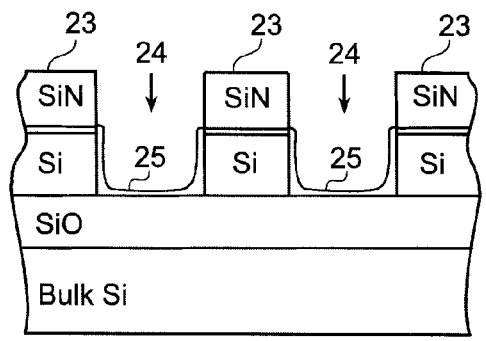
Figure 9:
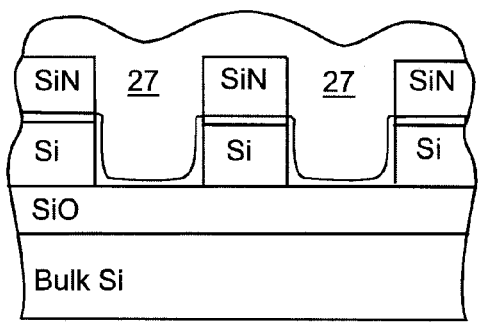
Figure 10:
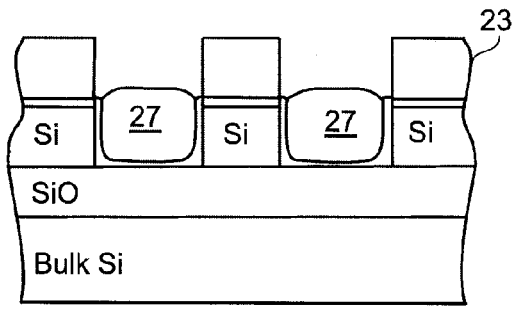
Figure 11:
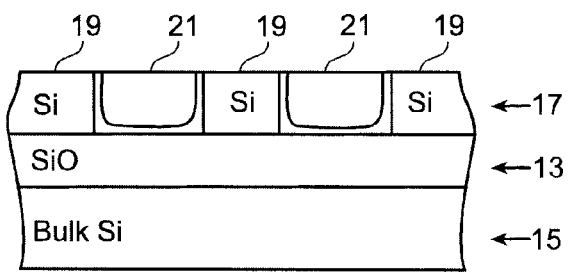
Figure 12:
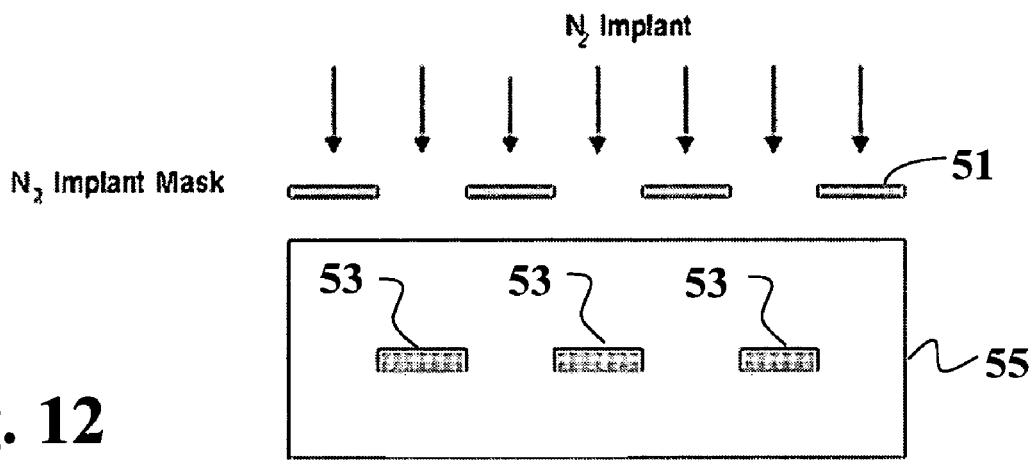
FIGS. 12 to 15 illustrates a process for simultaneously forming STI region during the fabricating of an SOI wafer, in accord with the present invention.

With reference to FIG. 12, the present invention takes advantage of the properties of chemical additives to retard, or enhance, oxide growth. In the presently preferred embodiment, nitrogen ($N_2$), which retards oxide growth is used as the additive to control the formation of STI regions. Thus, a mask 51 is used to selectively implant nitrogen ($N_2$) in areas where active regions are desired, i.e. where STI insulation regions should not be constructed. It is to be understood that if a chemical additive that enhances oxide growth, such as fluorine, were used instead, then mask 51 would provide openings over areas where STI regions were desired. Nonetheless, the presently preferred implantation of nitrogen ($N_2$) results in pockets of buried nitrogen 53 within the wafer 55. After completion of this selective implantation step, the present invention may continue with process steps similar to those of a typical SIMOX SOI manufacturing process.

Figure 13:
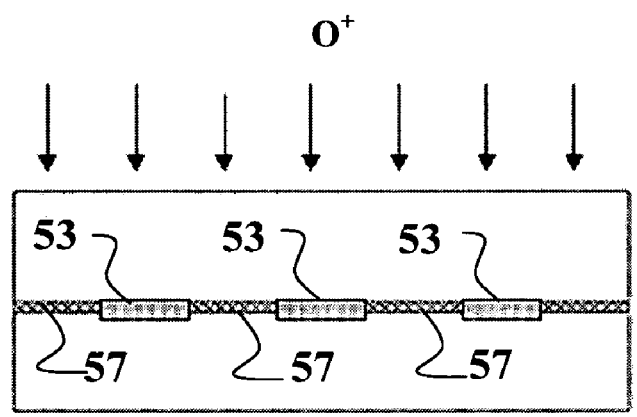

With reference to FIG. 13, mask 51 is removed, the surface of wafer 55 is subjected to an implantation of oxygen to a depth similar to that of the buried nitrogen 53. The present oxygen implantation is similar to that of a typical SIMOX process, as explained above. This results in oxygen regions 57 adjacent nitrogen regions 53. As shown, the implantation region of nitrogen may be slightly wider than that of oxygen, but the mechanics of nitrogen and oxygen implantation are well defined, and accurately controllable by standard IC manufacturing equipment such that it is not difficult to assure that the oxygen implanted over the nitride pockets 53 resides substantially within the nitrogen pocket 53. The nitrogen, $N_2$, implantation dose is preferably between $1\times10^{14}/cm^2$ and $1\times10^{15}/cm^2$, and the oxygen, $O_2$, dose is based on industry standard processing. The implant energy of the $N_2$ should preferably be such as to place it within the $O_2$ implant.

Figure 14:
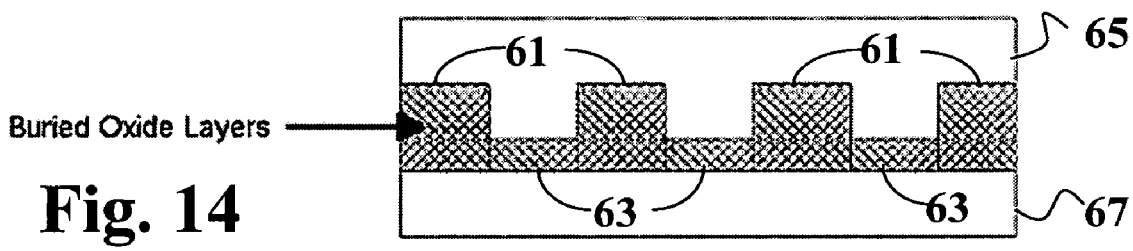

With reference to FIG. 14, the implantation step of FIG. 13 is followed by a heat-annealing step similar to that of a typical SIMOX process, as described above. As in a typical SIMOX process, the annealing step results in the growth of thick silicon oxide regions 61 in areas where pure oxygen pockets 57 are located. Since nitrogen retards the formation of silicon oxide, this annealing process also results in thinner oxide regions 63 where the pockets of nitrogen 53 are located. It is to be understood that silicon nitride may also form in the areas of nitrogen pockets 53, but silicon nitride is a good insulator such that its presence is consistent with the desired silicon-on-insulator structure.

At this point, the top silicon layer 65 is separated from the lower silicon layer 67 by thick 61 and thin 63 growths of oxide insulator.

Figure 15:
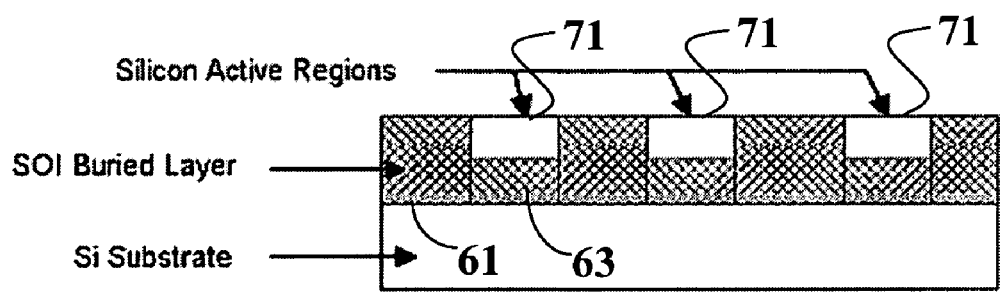

As shown in FIG. 15, the present process finishes with an etching and/or polishing step (such as through chemical mechanical polishing, CMP) that lowers the top surface of silicon layer 65 down to the level of thick silicon oxide regions 61. This results in pockets of active silicon 71 surrounded by thick oxide region 61 on its side and thinner oxide regions 63 from below. As a result, active silicon regions 71 are completely isolated and exhibit a shallow trench isolation structure without necessitating the prior art STI process steps describe above in reference to FIG. 5 to 11.

Thus, by adding a mask and implantation step to a SIMOX SOI process, the present invention achieves a shallow trench isolation structure on a SOI wafer without the cost and time required for constructing an STI structure on a SOI wafer.

While the invention has been described in conjunction with several specific embodiments, it is evident to those skilled in the art that many further alternatives, modifications and variations will be apparent in light of the foregoing description. Thus, the invention described herein is intended to embrace all such alternatives, modifications, applications and variations as may fall within the spirit and scope of the appended claims.

What is claimed is:

1. A method of forming isolation regions in a semiconductor substrate, comprising:
   implanting an oxygen reactive agent in first regions below a surface of said semiconductor substrate in a pattern defining active regions and isolation regions;
   implanting oxygen in said active regions and said isolation regions below said surface of said semiconductor substrate, said oxygen being implanted to a depth sufficient for permitting interaction with the implanted oxygen reactive agent in said first regions;
   subjecting said semiconductor substrate to an anneal process to grow an oxide layer below said surface of said semiconductor substrate using the implanted oxygen, wherein areas where the implanted oxygen interacts with said oxygen reactive agent have an oxide growth rate different than areas where the implanted oxygen does not interact with the oxygen reactive agent, such that said anneal process results in said oxide layer having greater growth regions and lesser growth regions as determined by the different growth rates;
   flattening a top surface of said semiconductor substrate such that an upper surface of the greater growth regions of the oxide layer are made substantially flush with said top surface of said semiconductor substrate, and the lesser growth regions of said oxide layer remain below said top surface of said semiconductor substrate;
   wherein semiconductor substrate regions over the lesser growth regions designate active regions and the greater growth designate isolation regions.

2. The method of claim 1, wherein said first regions coincide with said active regions.

3. The method of claim 2, wherein in said first regions, where the implanted oxygen interacts with the oxygen reactive agent, are made to have a slower anneal oxide growth rate than regions where said implanted oxygen does not interact with said oxygen reactive agent.

4. The method of claim 3, wherein said oxygen reactive agent is nitrogen.

5. The method of claim 1, wherein said first regions coincide with said isolation regions.

6. The method of claim 5, wherein in said first regions, where the implanted oxygen interacts with the oxygen reactive agent, are made to have a faster anneal oxide growth rate than regions where said implanted oxygen does not interact with said oxygen reactive agent.

7. The method of claim 6, wherein said oxygen reactive agent are is fluorine.

8. The method of claim 1, wherein said top surface of said semiconductor substrate is flatten by means of etch and polishing steps.

9. The method of claim 1, wherein when implanting oxygen in said active regions, said oxygen is implanted across the entire active regions.

10. The method of claim 1, wherein when subjecting said substrate to said anneal process, the resultant grown an oxide layer remains fully below the surface of the substrate.

11. The method of claim 1, wherein when flattening the top surface of said substrate, the surface is flattened down to expose the greater growth regions of the oxide layer that previously resided below the surface of the substrate.

12. A method of forming a silicon on insulator integrated circuit, comprising:
   implanting an oxygen reactive agent in first regions below a surface of a substrate in a pattern defining active regions and isolation regions;
   implanting oxygen in said active regions and isolation regions below the surface of said substrate, said oxygen being implanted to a depth sufficient for permitting interaction with said oxygen reactive agent in said first regions;
   subjecting said substrate to a heat anneal process to grow an oxide layer below the surface of the substrate using the implanted oxygen, wherein areas where the implanted oxygen interacts with said oxygen reactive agent have an anneal oxide growth rate different than areas where the implanted oxygen does not interact with oxygen reactive agent, such that said anneal process results in said oxide layer having greater growth regions and lesser growth regions as determined by the different growth rates;
   flattening a top surface of said substrate such that an upper surface of the greater growth regions of the oxide layer are exposed, and the lesser growth regions of said oxide layer remain below the top surface of said substrate, substrate regions over the lesser growth oxide regions being designated active regions, and said active regions being electrically isolated from each other by said greater growth oxide regions and lesser growth oxide regions; and
   constructing a circuit component in one of said designated active regions.

13. The method of claim 12, wherein said first regions coincide with said active regions.

14. The method of claim 13, wherein said first regions, where the implanted oxygen interacts with the oxygen reactive agent, are made to have a slower anneal oxide growth rate than regions where the implanted oxygen does not interact with said oxygen reactive agent.

15. The method of claim 14, wherein said oxygen reactive agent is nitrogen.

16. The method of claim 12, wherein first regions coincide with said isolation regions.

17. The method of claim 16, wherein in said first regions, where the implanted oxygen interacts with the oxygen reactive agent, are made to have a faster anneal oxide growth rate than regions where said implanted oxygen does not interact with said oxygen reactive agent.

18. The method of claim 17, wherein said oxygen reactive agent is fluorine.

19. The method of claim 12, wherein the top surface of said substrate is flatten by means of etch and polishing steps.

20. The method of claim 12, wherein when implanting oxygen in said active regions, said oxygen is implanted across the entire active regions.

21. The method of claim 12, wherein when subjecting said substrate to said heat anneal process, the resultant grown an oxide layer remains fully below the surface of the substrate.

22. The method of claim 12, wherein when flattening the top surface of said substrate, the surface is flattened down to expose the greater growth regions of the oxide layer that previously resided below the surface of the substrate.

* * * * *

UNITED STATES PATENT AND TRADEMARK OFFICE
CERTIFICATE OF CORRECTION

PATENT NO. : 7,384,857 B2 Page 1 of 1
APPLICATION NO. : 11/066206
DATED : June 10, 2008
INVENTOR(S) : Michael Hargrove It is certified that error appears in the above-identified patent and that said Letters Patent is hereby corrected as shown below:

<u>Column 4</u>
Line 36, please change "and isolation regions;" to --and said isolation regions,--

Signed and Sealed this

Twenty-fourth Day of February, 2009

JOHN DOLL
*Acting Director of the United States Patent and Trademark Office*